United States Patent [19]

Taniguchi

[11] 4,454,441

[45] Jun. 12, 1984

[54] PIEZOELECTRIC DRIVING APPARATUS

[75] Inventor: Toshihiko Taniguchi, Osaka, Japan

[73] Assignee: West Electric Company, Ltd., Osaka, Japan

[21] Appl. No.: 463,503

[22] Filed: Feb. 3, 1983

[51] Int. Cl.³ .............................................. H01L 41/08
[52] U.S. Cl. ..................................... 310/328; 310/369; 310/366
[58] Field of Search ............... 310/328, 367, 368, 317, 310/366

[56] References Cited

U.S. PATENT DOCUMENTS

| | | | |
|---|---|---|---|
| 3,377,489 | 4/1968 | Brisbane | 310/328 |
| 3,389,274 | 6/1968 | Robertson | 310/328 |
| 3,390,559 | 7/1968 | Steutzer | 310/328 X |
| 3,649,856 | 3/1972 | O'Neill | 310/328 |
| 3,684,904 | 8/1972 | Galutva et al. | 310/328 |
| 3,902,084 | 8/1975 | May, Jr. | 310/328 |
| 3,902,085 | 8/1975 | Bizzigotti | 310/328 |

FOREIGN PATENT DOCUMENTS 51-12497  4/1976  Japan .

*Primary Examiner*—Mark O. Budd
*Attorney, Agent, or Firm*—Cushman, Darby & Cushman

[57] ABSTRACT

A number of piezoelectric discs are stacked with electrodes inbetween for application of DC voltage thereto through a pair of lead wires, forming piezoelectric blocks, and a plurality of the piezoelectric block are stacked to form a moving member, which is inserted in a fixed member, a hollow case of rigid material such as steel; by applying voltages to electrodes of selected piezoelectric blocks, any selected block(s) can be driven either to decrease or increase the diameter and increase or decrease the thickness, thereby fixing selected block(s) to the fixed means or releasing of the fixing can be made freely and individually; and by appropriately combining voltage impressions timings and polarities to individual piezoelectric blocks, motion of the moving member in relation to the fixed member, for instance in a measuring worm-like way, is obtainable.

9 Claims, 26 Drawing Figures

PIEZOELECTRIC DRIVING APPARATUS

BACKGROUND OF THE INVENTION

1. Field of the Technology:

The present invention relates to a piezoelectric driving apparatus, which drives a driven member in relation to a fixed member, by programmed applications of voltages across electrodes disposed on piezoelectric members.

Figure 1:
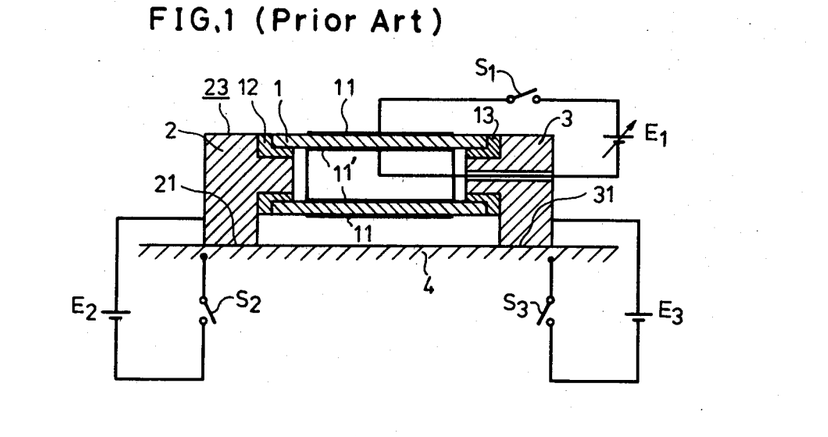
FIG. 1 is the schematical side view of the conventional piezoelectric driving apparatus.

2. Description of the Prior Art:

Hithereto, piezoelectric driving apparatus is known, for instance by a disclosure in Japanese Published examined Patent Application No. Sho 51-12497. The gist of this prior art is shown in FIG. 1. That is, the apparatus has a fixed member 4 and a moving member 23 which comprises a first end member 2 and a second member 3 which are slidably disposed on said fixed member 4. Between the first moving member 2 and the second moving member 3, a tubular piezoelectric member 1 is disposed, with their end parts fixed to the first end member 2 and the second end member 3, with coupling member such as bond layer on hard rubber couplers 12 and 13 inbetween, respectively. The tubular piezoelectric member 1 has electrodes 11 and 11' on its outside face and inside face, respectively, and a DC power source $E_1$ is connected thereacross with a switch $S_1$ inbetween. Across the first member 2 and fixed member 4, a second DC power source $E_2$ is connected with a switch $S_2$ inbetween. And across the second moving member 3 and the fixed member 4, a third DC power source $E_3$ is connected with a switch $S_3$ inbetween. The above-mentioned conventional apparatus makes the following operation: Firstly, switch $S_2$ is closed, thereby fixing the first member 2 to the fixed member 4 by a DC absorption source. And then, by closing the switch $S_1$, the piezoelectric element 1 is made to extend lengthwise, thereby moving the second moving member 3 rightward. Thereafter the switch $S_3$ is closed thereby fixing the second moving member 3 to the fixed member 4 by electrostatic attractive force. Then the first switch $S_2$ is open, thereby releasing the attraction of the first moving member 2. Then the switch $S_1$ is open, thereby to restore the piezoelectric element 1 to its normal length. And thereafter, switch $S_2$ is closed and the switch $S_3$ is open. Thus, the moving member 23 is driven by one step rightwards in a motion like a measuring warm. And by repeating the same operation, step by step motion is available.

However, the above-mentioned apparatuses is using fixing means of electrostatic force type, and therefore its utility is limited. For instance, the above-mentioned electrostatic fixing means requires a special members, and also gives some outside influence due to large DC voltage for the absorption. Furthermore, the above-mentioned conventional apparatus comprises piezoelectric devices and two electrostatic fixing devices. And the electrostatic fixing devices have no relation with the piezoelectric motion. Accordingly, the above-mentioned operation like the measuring warm movement requires a specially controlled operations of the switches S1, S2 and S3 in a good timing relation, and therefore a considerable care must be taken. This is also a reason why the utility of the conventional apparatus is limited.

SUMMARY OF THE INVENTION

This invention purposes to provide an improved piezoelectric driving apparatus which has rather simple configuration and is easily applicable for wide varieties of utilities.

That is, the present invention can provide a piezoelectric driving apparatus which uses only piezoelectric mechanism, dispensing with other fixing motion such as electrostatic attraction or the like.

The piezoelectric driving apparatus in accordance with the present invention comprises a driving member having a piezoelectric element having plural blocks, which are controllable individually, and a fixed member which is mechanically engaged with the driving member. The composite block of the driving member can move in relation to the fixed member by applying voltages to the piezoelectric members in a predetermined sequence.

Although novel features which are believed to be characteristic of the present invention are pointed out in the appended claims, the invention itself, as to its objects and advantages, and the manner in which it may be carried out, may be better understood by reference to the following detailed description taken in connection with the accompanying drawings.

DESCRIPTION OF THE PREFERRED EMBODIMENTS

Piezoelectric driving apparatus in accordance with the present invention comprises a fixed member and a moving member which comprises a plural number of piezoelectric blocks having piezoelectric substance, each of the block having electrodes for application of voltage in operative relation with direction of electric polarization in the block, to produce secondary piezoelectric effect at the application of a voltage thereto, at least two engaging means respectively fixed to the at least two units of the plural number of piezoelectric units for making engagement of the unit to the fixed member, voltage application means for applying voltage to the electrodes with a predetermined sequence to make the secondary piezoelectric effect in a manner that the piezoelectric blocks individually make increase or decrease of size in one direction to make or release the engagement and decrease or increase of size in another direction to make driving of a part which is not then engaged with the fixed member.

The fixed member may be a pipe when the moving member comprises a number of stacked discs of piezoelectric substance, or alternately, the fixed member may be a rod when the moving member comprizes a plural number of stacked piezoelectric discs having holes in which the rod is inserted. Further, the moving member further may be a pipe shaped piezoelectric substance having a number of ring shaped electrodes pair on inside wall and outside wall, and in such case the fixed member may be a rigid pipe which contains the moving member of piezoelectric pipe, or alternately, the fixed member can be a rod to be inserted in the hollow of the piezoelectric pipe.

The moving member comprising a plurality of the piezoelectric discs are divided into plural blocks, each comprising several piezoelectric discs. The discs are stacked with electrodes and bonded by adhesive, e.g. thermo-setting resin bond. The neighboring plural blocks of the piezoelectric elements are divided by an electrically disabled region. The disabled region may be a piezoelectric disc which is not applied with electric field, or an ordinary insulator board such as plastic disc. In order to efficiently electrify the plurality of the piezoelectric discs, it is preferable that the neighboring piezoelectric discs are selected to have opposite polarizations each other.

Figures 2A, 2B:
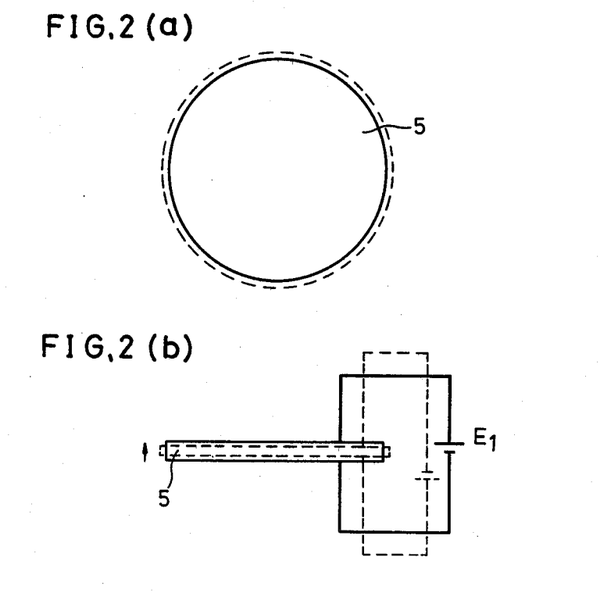
FIG. 2(a) is a front view showing operation of a piezoelectric disc of an example in accordance with the present invention.
FIG. 2(b) is a side view with related circuit of a piezoelectric disc of FIG. 2(a).

FIG. 2(a) is a front view of a piezoelectric disc of a piezoelectric block to compose the moving member. And FIG. 2(b) is a side view of the disc with relative electric circuit. As shown in FIG. 2(a) and FIG. 2(b), when a voltage of a polarity in the same direction as the polarization of the piezoelectric disc is impressed across the electrodes of the piezoelectric disc 5, the piezoelectric disc 5 decreases its thickness and increases its diameter as shown by dotted lines in FIG. 2(a) and FIG. 2(b); and when the polarity of the voltage is inversed, the piezoelectric disc shrinks in its radial direction and expands in its thickness. And the relation between the polarity of the voltage and the movement of the expanding and shrinking is dependent on internal dielectric polarization of the piezoelectric disc 5. And such secondary piezoelectric nature of the piezoelectric substances is known for piezoelectric known ceramic material.

The present invention utilizes the above-mentioned changes of sizes in the directions of thickness and in the directions vertical to the thickness (e.g. radial directions). That is, by utilizing changes of radial size, the piezoelectric block can be fixed to the fixed member.

Figure 3A:
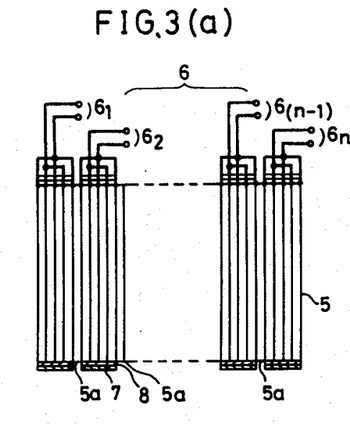
FIG. 3(a) is a side view of a moving member comprising a number of piezoelectric discs of FIG. 2(a) and FIG. 2(b).
Figure 3B:
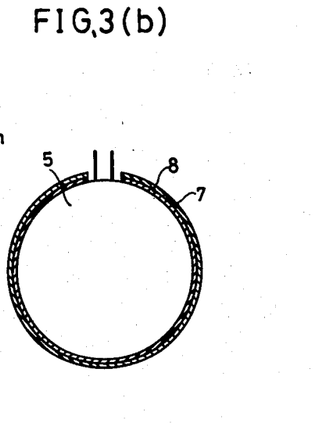
FIG. 3(b) is a sectional front view of the moving member of FIG. 3(a).
Figures 3C, 3D, 3E:
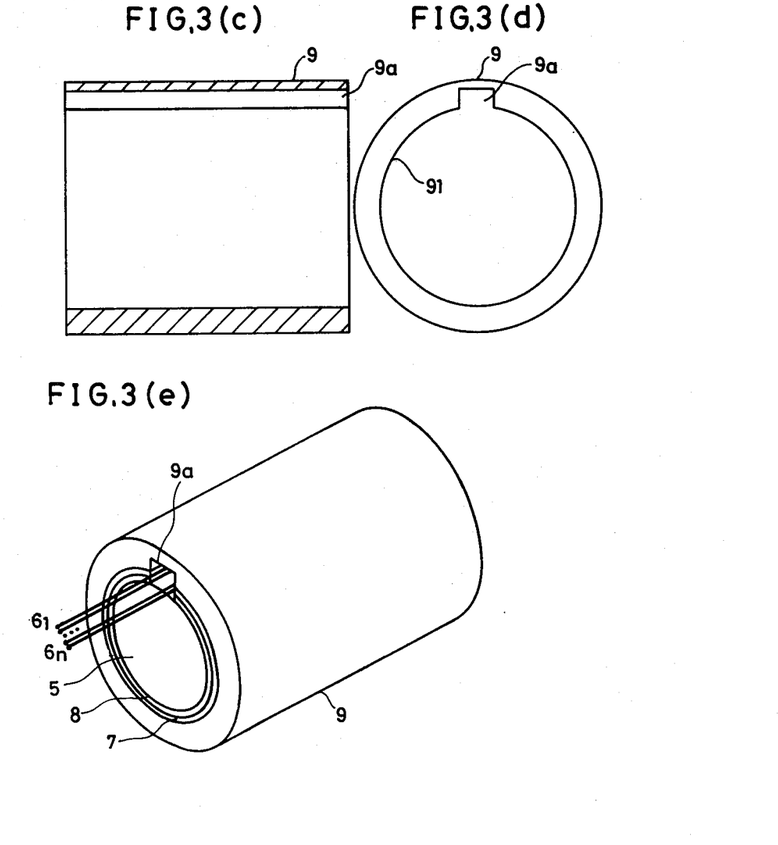
FIG. 3(c) is a sectional side view of a fixed member to be combined with the moving member shown in FIG. 3(a) and FIG. 3(b).
FIG. 3(d) is a front view of the fixed member of FIG. 3(c).
FIG. 3(e) is a perspective view of a piezoelectric driving apparatus comprising the moving member shown in FIG. 3(a) and FIG. 3(b) and the fixed member shown in FIG. 3(c) and FIG. 3(d).

FIG. 3(a) is a schematical side view of one example of the present invention wherein piezoelectric discs 5 having electrodes on both principal faces thereof are stacked in the direction of their thickness, to constitute the moving member. FIG. 3(b) is its front view. FIG. 3(c) is a sectional side view of a fixed member wherein the moving member of FIG. 3(a) and FIG. 3(b) are to be inserted, and FIG. 3(d) is a front view of the fixed member, and FIG. 3(e) is an assembled perspective view of the present example.

As shown in FIG. 3(a), the stacked piezoelectric discs 5 constitute a moving member having plural blocks each comprising a predetermined number of piezoelectric discs, each having electrodes. Or alternatively, the piezoelectric discs are stacked alternately with electrode discs. Several electrodes are connected to form one block and connected to each pair of lead wires $6_1$, $6_2 \ldots 6_{(n-1)}$ or $6_n$. Each block of the disc has insulation film 8 on circular periphery thereof. And an engaging ring 7, which preferably has a Young's modulus similar as that of the piezoelectric disc, being made of, for instance aluminum, is formed on the insulation film 8 except at the part of lead wire connections.

Figure 7:
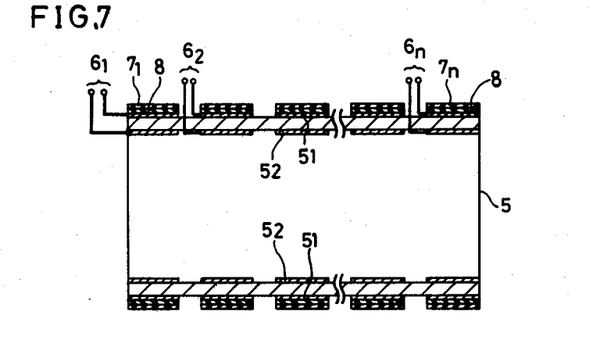
FIG. 7 is a sectional side view of another example wherein piezoelectric member comprises a continuous pipe shaped piezoelectric element 5' on which a plural number of pairs of inside electrode and outside electrode are provided.
Figure 8:
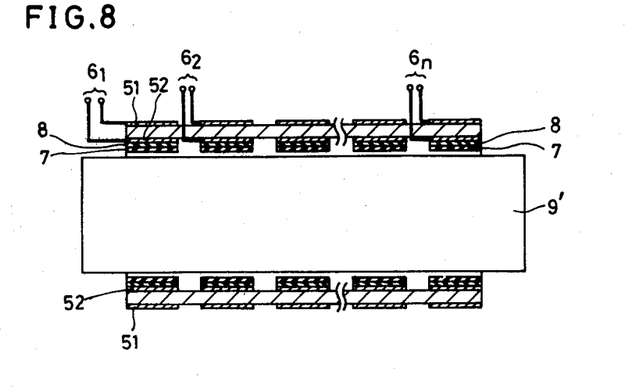
FIG. 8 is a sectional view of still another example wherein piezoelectric member comprises a continuous pipe shaped piezoelectric element 5' on which a plural number of pairs of inside electrode and outside electrode are provided.

The fixed member 9 of this example is a rigid pipe such as of brass having a through hole 91 which has an inside diameter slightly larger than the diameter with the engaging ring 7 of the piezoelectric disc at the state of shrinked radial size, so that when the piezoelectric discs increase their planar sizes, the engaging ring 7 engages with the inside face of the through hole 91. One part of the inside hollow of the fixed member has a groove 9a for passing the lead wires from the piezoelectric discs. Between the blocks of the piezoelectric discs, there are disposed electric insulators 5a in order to permit individual operation of the blocks. The engaging ring 7 bonded at peripheral part of the piezoelectric discs may be divided into suitable parts along the periphery or may be provided with several cuttings in parallel direction with the axis of the disc in order that the variation of planar size of the piezoelectric disc can be made freely. It is a matter of course that the piezoelectric disc 5 can be formed ring-shaped as shown in FIGS. 7 and 8.

The operation of the example shown in FIG. 3(a) to FIG. 3(e) is elucidated with reference to FIG. 4(a) to FIG. 4(f), which are schematical sectional views of the piezoelectric driving apparatus of FIG. 3(a) to FIG. 3(e), wherein it is provided that the moving member has n blocks $10_1, 10_2 \ldots 10_{(n-1)}$ and $10_n$. For the simplicity of explanation, the displacement of the blocks are expressed in exaggerated size in axial direction (horizontal of the figures).

Each piezoelectric disc increases its diameter when a voltage of the same polarity as the polarization of the piezoelectric substance, and decreases its thickness when the polarity of the voltage is inversed. Therefore, when the former voltage is impressed to a piezoelectric disc block, then the engaging ring 7 of the block engages with the through hole 91 of the fixed member 9 due to increase of the diameter, and fixes the block to the fixed member 9. On the contrary, when a voltage inverse to the direction polarization of the piezoelectric disc is impressed to a piezoelectric disc block, then the engagement is released due to the shrinking of the diameter of the block.

Figure 4A:
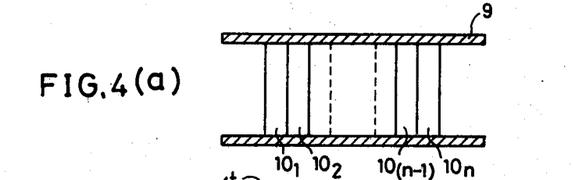
FIG. 4(a), FIG. 4(b), FIG. 4(c), FIG. 4(d), FIG. 4(e) and FIG. 4(f) are schematic side views for explaining operation of the piezoelectric driving apparatus of FIG. 3(e).
Figure 4B:
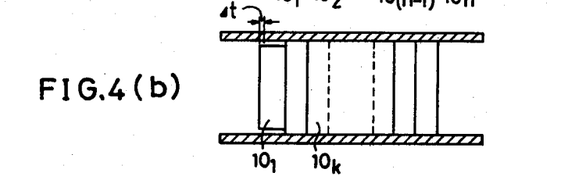

Now, provided that all the block of the piezoelectric discs are impressed with voltage of the same polarity as the polarization of the piezoelectric element, than all the blocks are fixed to the fixed member 9 as shown in FIG. 4(a). Then from such state, the leftest block $10_1$ is applied with a voltage of inverse polarity, then the leftest block shrinks its diameter, and releases its engagement as shown in FIG. 4(b). In this state, the leftest block increases its thickness by $\Delta t$, which is a very small length of unit displacement. Accordingly, by one by one applying the voltage of such polarity to increase the thickness, a considerably displacement is obtainable at the lefest end part. For instance, by fixing the fixed member 9 and connecting the leftest block $10_1$ to an object means, for instance minute displacing means such as a sample holder of an electron microscope or vise versa, a very small displacement can be made.

Figure 4C:
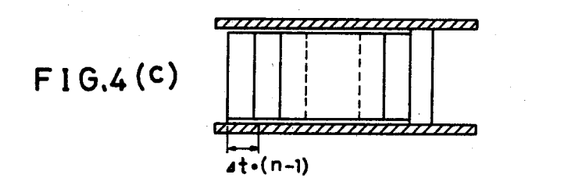
Figure 4D:
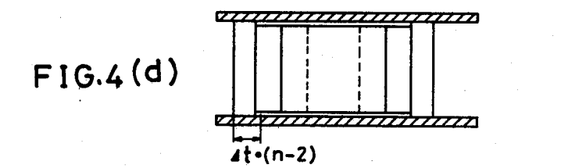
Figure 4E:
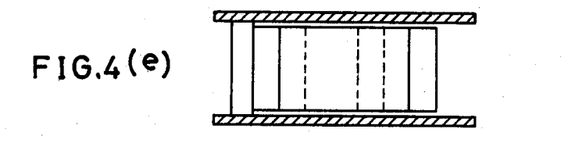
Figure 4F:
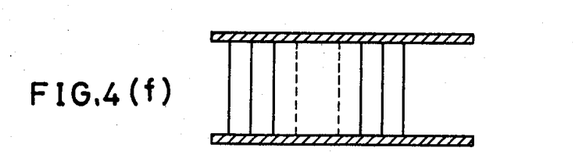

When a larger displacement is necessary, the following operation of measuring worm type can be used. This type of driving is made by repeating the operation as shown in FIG. 4(a) to FIG. 4(f). That is, first from the fixed state of FIG. 4(a), all the blocks except the rightest one $10_n$ are applied with the voltage of inverse polarity to the polarization, then the blocks except the rightest one increase their thickness thereby considerably, displacing the lefest end block as shown in FIG. 4(c). Then the voltage of the leftest end block is switched to the same polarity as the polarization, thereby to fix it to the fixed member 9. As shown in FIG. 4(d) and thereafter, the rightest block $10n$ is impressed with the inverse voltage to release it from the fixed member 9 as shown in FIG. 4(e). And thereafter, by impressing the voltage of the same polarity as the polarization on all the blocks, all the blocks are fixed to the fixed member 9 at a displaced position as shown in FIG. 4(f).

By repeating the above-mentioned operations, the moving member 23 can be displaced step by step for a desired distance, and total distance D of the displacement is given by $D = \Delta T \times (n-2)$, where n is the number of the piezoelectric disc blocks. Therefore, by repeating the above-mentioned process for M times, a total distance of $M \times \Delta T \times (n-2)$ can be obtained.

And further, a fine adjustment can be made by applying inverse voltages to the blocks of from $10_1$ to $10_k$. Then, small displacement of $k \times \Delta T$ is obtainable.

Figures 5A, 5B:
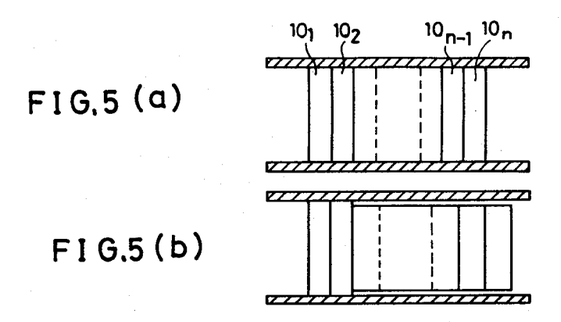
FIG. 5(a), FIG. 5(b), FIG. 5(c), FIG. 5(d), FIG. 5(e), FIG. 5(f), FIG. 5(g), and FIG. 5(h) are schematical side views for illustrating another operations of the piezoelectric driving apparatus of FIG. 3(e).
Figure 5C:
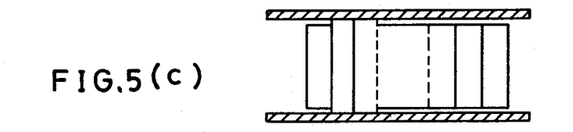
Figure 5D:
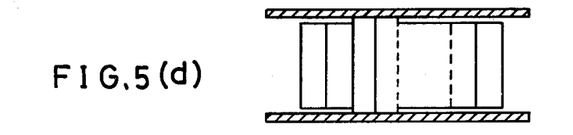
Figure 5E:
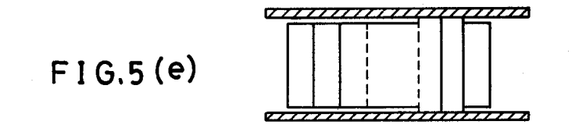
Figure 5F:
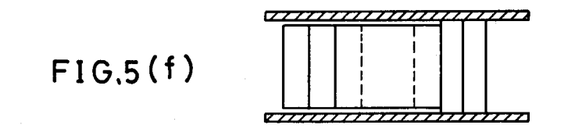
Figure 5G:
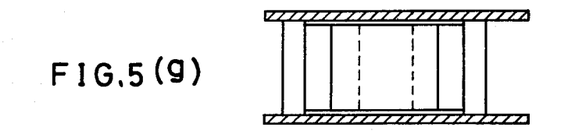
Figure 5H:
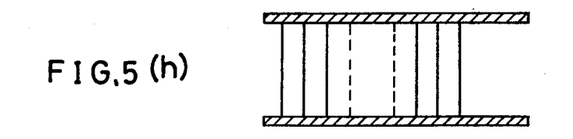

FIG. 5(a) to FIG. 5(h) show another way of minute displacement. That is, firstly from the fixed state of FIG. 5(a), all the blocks except the leftest two discs $10_1$ and $10_2$ are applied with the voltage of inverse polarity to the polarization, then the blocks applied with the voltage increases their thickness considerably, displacing the rightest part as shown in FIG. 5(b). Next, the leftest block $10_1$ is released from the fixing as shown in FIG. 5(c), and the third and fourth left block is fixed. Thirdly, the fourth left block is fixed and the second left block is released from fixing, as shown in FIG. 5(d). Thus the fixed blocks move one step by one step rightwards while the previously fixed block is still kept fixed. By such way of displacement, the left end part and right end part of the moving member slowly displaces step by step by $\Delta T$ displacement per one step of the process between FIG. 5(b) to FIG. 5(f). And thereafter, by fixing the leftest block as in FIG. 5(g), and thereafter stepping to FIG. 5(h) by releasing the rightest blocks followed by shrinking thicknesses of all the blocks of $10_2$ to $10_n$, the whole process of this way of displacement is finished. That is, the way of displacement of FIG. 5(a) to FIG. 5(h) is earth worm like movement.

As has been described, the above-mentioned example can drive the object by three kinds of displacement way, and accordingly is very useful in application for various fields such as microscopic observation, registration of photoetching mask in semiconductor making or focal adjustment of lens in a camera, or the like.

Figure 6:
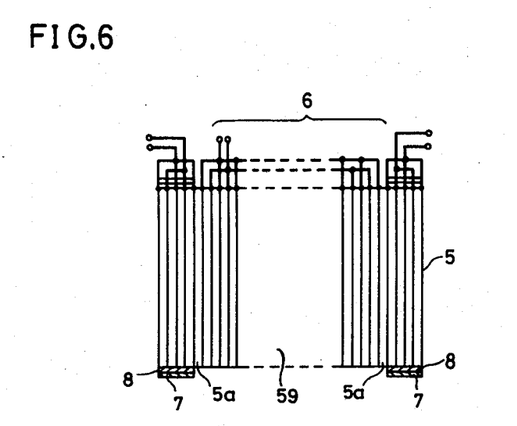
FIG. 6 is a schematical side view of the moving member of the piezoelectric driving apparatus of FIG. 3(e) with another electric connection.

FIG. 6 shows another example, wherein piezoelectric disc blocks are grouped in three blocks, that is several disc block in the left end part, another several disc block on the right end part, and a plurality of disc block at the intermediate part 59, and in this very thick intermediate block 59, there is no engaging means are provided. This apparatus is only aiming the displacement motion in the measuring warm pattern, but not in the earth worm pattern.

FIG. 7 shows another example wherein the moving member has piezoelectric element comprising one continuous pipe-shaped piezoelectric substance 5', whereon a plurality of ring-shaped outside electrodes 51 and ring-shaped inside electrodes 52 are provided to form parallel rows of electrodes. By application of a voltage across each other opposing inside electrode 52 and outside electrode 51, the piezoelectric substance at that part extends its axial length, and shrinks its diameter of pipe, at impression of the same polarity voltage as the polarization across the electrodes. And when the voltage polarity is reversed, the opposite direction movement is made.

Though the example of FIG. 7 uses a continuous piezoelectric substance pipe 5', another modification can be made such that the piezoelectric pipe 5' is constituted with short segmented pipes, each having the same length in the axial direction as the length corresponding the axial pitches of the ring shaped electrodes 51, 52. And the short segmented pipes are bonded to form a unitary pipe 5. The moving member of FIG. 7 is inserted in the fixed member, such as, of FIG. 3(c) and FIG. 3(d).

The operation of the example of FIG. 7 is quite the same as the example of FIG. 3(e). That is the example of FIG. 7 can be operated in either of the above-mentioned three ways of operations. Furthermore, the example of FIG. 7 has the piezoelectric element of pipe shaped configuration. And therefore, the forming of the electrodes become very simple in comparison with the preceding examples. And the variations of size in radial direction and axial direction of piezoelectric element can be designed fairly freely.

That is, in the preceding example of FIG. 3(a) to FIG. 3(e), the thickness of each piezoelectric disc, which is perpendicular to the direction of radial direction, must be well controlled in order to design the unitary displacement $\Delta T$ in a selected value. And this thickness is what the voltage is impressed across. When thickness of a piezoelectric disc increases, then the voltage necessary for making a desired variation of thickness becomes higher. Accordingly, the electric circuit for controlling voltage impressions on them becomes complicated. Accordingly in the preceding example, to control thickness of all piezoelectric discs in manufacturing is actually difficult. And the piezoelectric discs are made thin and they must be stacked with electrodes inbetween. And without in order to make such moving member, such time-taking stacking is considered necessary, and such assembling seems to be an obstacle to obtaining uniform characteristic when actual use is considered. On the contrary, in the example of FIG. 7 the forming of electrodes are simple and axial length of each block of the piezoelectric elements can be designed with a considerable freedom. Accordingly, when actual uses are considered, piezoelectric apparatus of various characteristics is easily obtainable with rather simple configuration and with good quality control.

Still modified example can be devised with respect to the configuration of the moving member with the pipe shaped piezoelectric element. FIG. 8 shows such modified example wherein a pipe shaped piezoelectric element is combined with fixed member 9' disposed inside the hollow part of the pipe shaped piezoelectric element. Engaging ring 7 and insulating film 8 are disposed on inside face. In this example, for instance photographic camera lens or microscope camera lens can be mounted inside hollow of either of pipe shaped fixed member 9' or in the inside hollow of the moving member comprising the pipe shaped piezoelectric element 5. With such configuration, a fine and accurate adjustment of lenses can be made with simple configuration.

Figure 9:
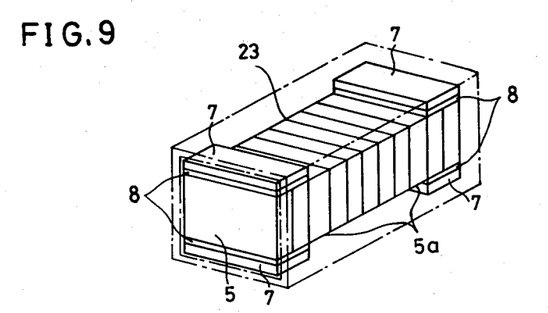
FIG. 9 is a perspective view of still another example in accordance with the present embodiment wherein the piezoelectric elements are square plate shaped.

FIG. 9 shows another example of the present invention wherein the moving member is theoretically identical with that shown FIG. 6. And accordingly, corresponding parts are designated with the same numerals as those of the preceding example. As is shown in the perspective view of FIG. 9, the piezoelectric blocks 23 comprises square plate shaped elements instead of disc shaped ones as in the preceding examples. The other parts corresponding to the preceding examples are designated by the same numerals as the preceding example. Of course in this example of FIG. 9, since the outside shape of the piezoelectric element is square, the fixed member 9 to be coupled with the moving member has a through-hole of rectangle paralleloid shape to receive the moving member. The engaging members 7,7,7 and 7 are disposed only on the upper end parts and lower end parts of the moving member 23. That is, in this example, the force to be utilized for engagement is in the vertical direction only. However, this example has a proper utility in case the apparatus can not be constituted with circular section.

As has been elucidated with reference to the foregoing examples, the piezoelectric driving apparatus in accordance with the present invention has simple configuration that its motion mechanism is only utilizing the secondary piezoelectric effect, and no other motion or force such as electrostatic absorption is used. Accordingly, the apparatuses are simple and reliable. And further, there is no fear of trouble to be caused by high DC voltage to be used in electrostatic absorption mechanism or the like. And furthermore, since a plurality of piezoelectric units are used, several ways of driving, that is, quicker motion, slow but very fine motion, and short fine additional adjustment are obtainable. And accordingly, the apparatus has a wide range of utility in optical apparatus field and other fields.

Though the member to be combined with the moving member is referred as the name of "fixed member", it is naturally apparent for skilled person in the art that the motion of the moving member and the fixed member are relative to each other, and accordingly, either member may be fixed to a frame or chasis or casing of related apparatus in actual applications, so that the other member may be used as driving means to actuate an object article in the apparatus.

I claim:

1. A piezoelectric driving apparatus comprising:
   a fixed member and
   a moving member which comprises
   a plural number of piezoelectric blocks having piezoelectric substance, each of said blocks having electrodes for application of voltage in operative relation with the direction of electric polarisation in said block, to produce secondary piezoelectric effect at the application of a voltage thereto,
   at least two engaging means respectively fixed to at least two of said plural number of piezoelectric blocks for making engagement to said fixed member, and
   voltage application means for applying voltage to said electrodes with a predetermined sequence to make said secondary piezoelectric effect in a manner that said piezoelectric blocks individually increase or decrease in size in one direction to make or release said engagement and decrease or increase in size in another direction to make driving of a part which is not then engaged with said fixed member,
   said piezoelectric blocks comprising stacked plural piezoelectric discs wherein neighboring discs have opposite direction of polarisation,
   said plural number of piezoelectric blocks being isolated with each other by forming a disabled region, and
   said disabled region being disabled by electrically isolating said piezoelectric substance.

2. A piezoelectric driving apparatus in accordance with claim 1, wherein said piezoelectric number of piezoelectric disabled region is a part of said piezoelectric substance which is electrically disabled by disposing not to be impressed with a voltage.

3. A piezoelectric driving apparatus in accordance with claim 1, wherein said plural number of piezoelectric blocks are isolated by means of an insulator which does not damage the characteristic of displacement of said piezoelectric substance.

4. A piezoelectric driving apparatus in accordance with claim 1, wherein said engaging means is made of a substance having a Young's modulous which is substantially analogous to that of the piezoelectric element and is made in such thinness that said secondary piezoelectric effect is not hindered by the engaging means.

5. A piezoelectric driving apparatus in accordance with claim 1, wherein said engaging means are provided individually on all of said piezoelectric blocks and all of said piezoelectric blocks has electrodes for application of voltage thereto.

6. A piezoelectric driving apparatus in accordance with claim 1, wherein said engaging means are provided on said piezoelectric blocks at both ends only, and each of said piezoelectric blocks at both ends has electrodes for application of voltage thereto and other blocks disposed between these end blocks has electrodes connected to receive a common voltage at the same time.

7. A piezoelectric driving apparatus in accordance with claim 1, wherein said piezoelectric substance is pipe-shaped and polarized in radial direction.

8. A piezoelectric driving apparatus in accordance with claim 7, wherein said electrodes are pair of ring-shaped inside-electrodes and ring-shaped outside-electrodes each facing said pipe-shaped piezoelectric substance inbetween.

9. A piezoelectric driving apparatus in accordance with claim 1, wherein said piezoelectric blocks comprises square section plates of piezoelectric substances, said engaging means are provided on opposing outside faces of said rectangle-shaped moving member at least at both end parts.

* * * * *